United States Patent [19]

Shinokura et al.

[11] Patent Number: 5,181,213
[45] Date of Patent: Jan. 19, 1993

[54] OPTICAL PULSE GENERATING APPARATUS

[75] Inventors: Kiichiro Shinokura, Tendo; Hitoshi Kawaguchi, Yonezawa, both of Japan

[73] Assignee: Pioneer Electronic Corporation, Tokyo, Japan

[21] Appl. No.: 734,973

[22] Filed: Jul. 24, 1991

[30] Foreign Application Priority Data

Jul. 27, 1990 [JP] Japan .................. 2-199880

[51] Int. Cl.$^5$ .................. H01S 3/13; G02B 6/26
[52] U.S. Cl. .................. 372/30; 372/6; 372/18; 372/44; 372/92; 372/97; 372/99; 385/38; 385/147
[58] Field of Search .......... 385/38, 37, 88, 147; 372/6, 18, 19, 30, 31, 32, 43, 44, 49, 50

[56] References Cited

U.S. PATENT DOCUMENTS

| | | | |
|---|---|---|---|
| 4,358,851 | 11/1982 | Scifres et al. | 372/6 X |
| 4,812,005 | 3/1989 | Heywang | 372/6 X |
| 4,835,778 | 5/1989 | Kafka et al. | 372/6 |
| 4,904,041 | 2/1990 | Izadbanah | 372/18 |
| 4,930,131 | 5/1990 | Sizer | 372/18 |
| 4,955,025 | 9/1990 | Mears et al. | 372/6 |
| 5,008,887 | 4/1991 | Kafka et al. | 372/6 |
| 5,128,950 | 7/1992 | Tsuchiya et al. | 372/30 X |

FOREIGN PATENT DOCUMENTS 0246793 11/1987 European Pat. Off. .......... 385/38 X
2178591 2/1987 United Kingdom .............. 385/38 X

OTHER PUBLICATIONS

G. Eisenstein et al., "Active Mode-Locking Characteristics of InGaAsP-Single Mode Fiber Composite Cavity Lasers", IEEE Journal of Quantum Electronics, vol. QE-22, No. 1, Jan. 1986, pp. 142-148.

K.Y. Lau, "Short-Pulse and High-Frequency Signal Generation in Semiconductor Lasers", Journal of Lightwave Technology, Vol. 7, No. 2, Feb. 1989, pp. 400-419.

E. Brinkmeyer et al. "Fibre Bragg Reflector for Mode Selection and Line-Narrowing of Injection Lasers", Electronics Letters, vol. 22, No. 3, Jan. 30, 1986, pp. 134-135.

*Primary Examiner*—Brian Healy
*Attorney, Agent, or Firm*—Sughrue, Mion, Zinn, Macpeak & Seas

[57] ABSTRACT

An optical pulse generating apparatus having a semiconductor laser medium and an external resonator comprising an optical waveguide path. A reflecting element in the optical guide path is given such a reflection wavelength characteristic as to suppress other components than the component of an oscillation main longitudinal mode, so that the level of the main longitudinal mode component is raised and optical pulses with a narrower spectrum width and pulse width are produced.

8 Claims, 2 Drawing Sheets

OPTICAL PULSE GENERATING APPARATUS

BACKGROUND OF THE INVENTION

1. Field of the Invention

The present invention relates to an optical pulse generating apparatus, and more particularly, to an optical pulse generating apparatus having a semiconductor laser medium as its light source.

2. Description of Background Information

There are optical pulse generating apparatuses which have a semiconductor laser medium as a light source, and are configured in such a way that an optical fiber for forming an optical waveguide path is coupled to the light-emitting face of the semiconductor laser medium, forming an external resonator, and mode locking oscillation of the semiconductor laser medium is produced to generate optical pulses.

With such an optical pulse generating apparatus, generation of optical pulses with a narrow spectrum width of 100 GHz or below and a pulse width as narrow as 50 pS (picoseconds) or below is desired. For the generation of such optical pulses, it is necessary, due to lower wavelength-dependency of the reflectivity by a uni-mode fiber, to reduce the reflectivity $R_2$, of the non-reflecting coating on the end face of the semiconductor laser medium where the optical fiber is coupled, to a level about $R_2 \approx 2 \times 10^{-4}$. This value is however impractical, and actually it is difficult to ensure the reproducibility at $R_2 \approx 10^{-2}$ or below. As the reflectivity $R_2$ increases, the longitudinal mode, which is dependent on the element's length, of the semiconductor laser medium (this mode will be hereinafter called "device mode") is enhanced, to produce an oscillation spectrum as indicated by the solid line in FIG. 1. This increase in $R_2$ reduces the level of the main oscillation mode component, thus imposing restriction on narrowing the spectrum width and pulse width of optical pulses.

OBJECT AND SUMMARY OF THE INVENTION

It is therefore an object of the present invention to provide an optical pulse generating apparatus capable of producing optical pulses with a narrow pulse width and narrower spectrum width even when the reflectivity of the end face of a semiconductor laser medium where an optical fiber is coupled is about 1% ($=10^{-2}$).

To attain this object, the present invention is provide an optical pulse generating apparatus comprising a semiconductor laser medium and an external resonator for producing mode locking oscillation of the semiconductor laser medium to generate optical pulses; wherein the external resonator comprises an optical waveguide path including a reflecting element for reflecting a part of a laser beam emitted from the semiconductor laser medium; said reflecting element having a reflection wavelength characteristic wherein a center wavelength in a high-reflectivity wavelength range falls within a gain wavelength range of the semiconductor laser medium and a half-amplitude level is equal to or lower than twice an interval between device modes.

According to the optical pulse generating apparatus embodying the present invention, the reflecting element in the optical waveguide path suppresses components of the semiconductor laser medium other than the component of the element mode having a highest gain (which mode will be hereinafter referred to as "oscillation main longitudinal mode"), thereby improving the level of the component of the oscillation main longitudinal mode as a consequence.

DETAILED DESCRIPTION OF THE PREFERRED EMBODIMENT

A preferred embodiment of the present invention will now be described referring to the accompanying drawings.

Figure 2:
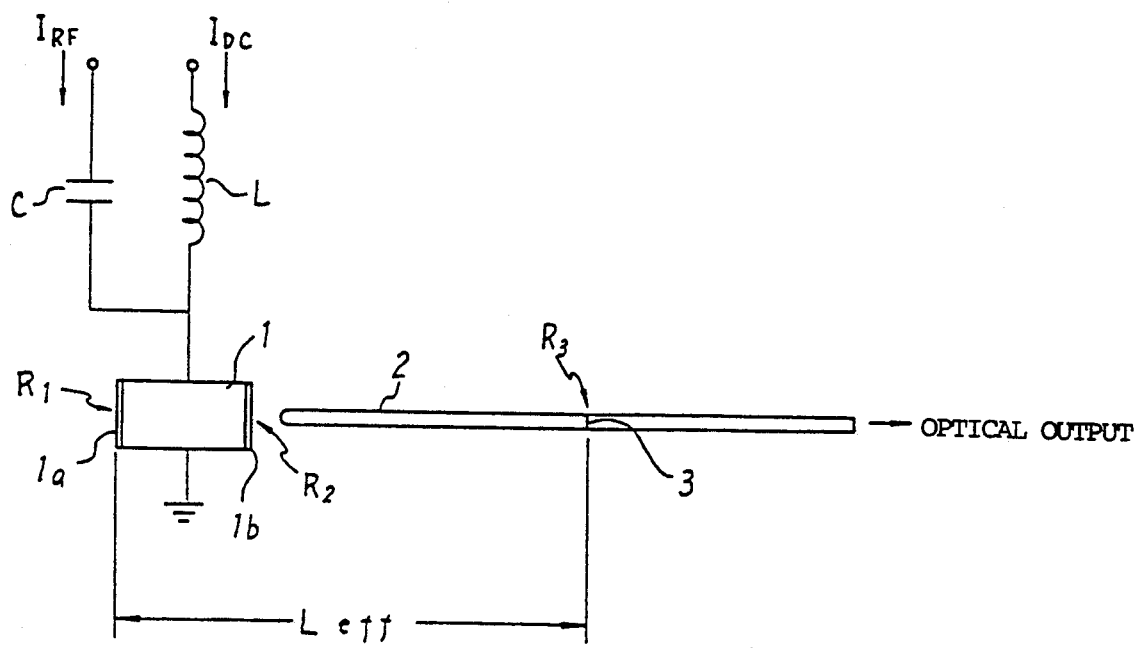
FIG. 2 is a diagram showing the structure of an optical pulse generating apparatus embodying the present invention.

Referring to FIG. 2, a semiconductor laser medium element 1 has one end face 1a serving as a high-reflection face and the other end face 1b serving as a low-reflection, light-emitting face. The reflectivity of the high-reflection face 1a, that is, $R_1$, is set more than 0.9, while the reflectivity of the light-emitting face 1b, that is, $R_2$, is set nearly equal to $10^{-2}$. This semiconductor laser medium element 1 is supplied with an RF (high-frequency) current $I_{RF}$ for mode locking through a capacitor C, and is further supplied with a bias-applying DC current $I_{DC}$ through an inductance coil L.

Figure 3:
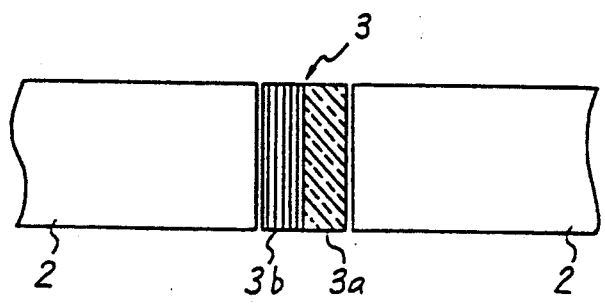
FIG. 3 is a cross section exemplifying the structure of the reflecting element in FIG. 2.

The light-emitting face 1b of the semiconductor laser medium element 1 is coupled with, for example, an optical fiber 2 which forms an optical waveguide path. This optical fiber 2 has a reflecting element 3 at its center, for example, whose reflectivity $R_3$ is about 0.6, and thus constitutes an external resonator which oscillates the semiconductor laser medium element 1 in mode locking. The reflecting element 3 has a multi-lamination (for example, six layers) of transparent layers 3b having different reflectivities coated on a transparent substrate 3a of glass, quartz, alumina or the like, as shown in FIG. 3, for example, and has a particular reflection wavelength characteristic that will be described later. It is to be noted that the reflecting element 3 is not restricted to this design, and it may have a diffraction grating structure formed in the optical fiber by etching or may take any other forms as long as it has a predetermined reflection wavelength characteristic. The location of the reflecting element 3 is not limited to the center of the optical fiber 2, and it may be placed at a light-emitting end of the fiber 2.

Figure 1:
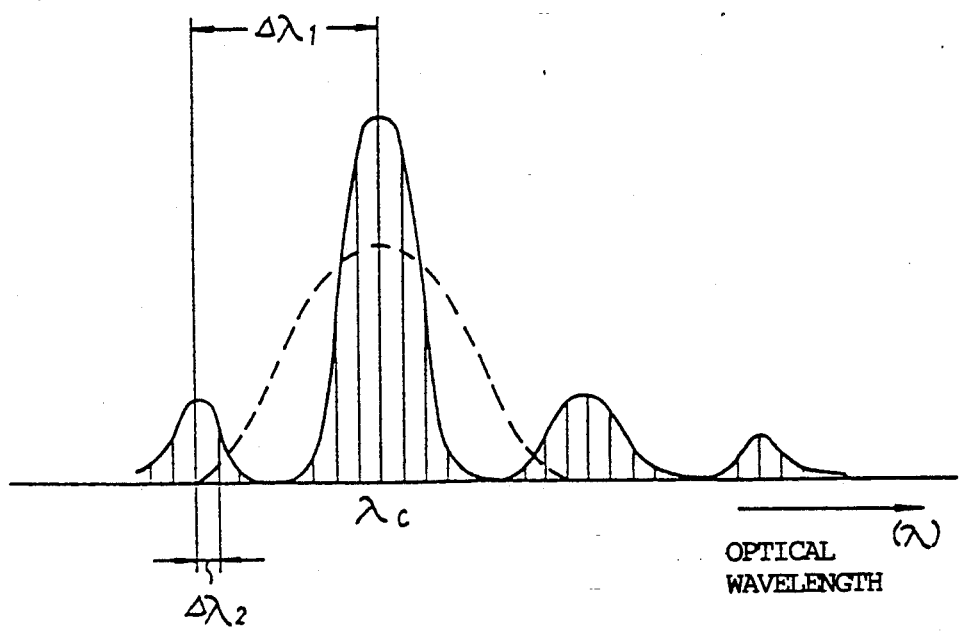
FIG. 1 is a diagram illustrating the spectrum (solid line) of a semiconductor laser medium in oscillation longitudinal mode and the reflection wavelength characteristic dashed line) of a reflecting element.

The reflecting element 3 has a reflecting wavelength characteristic wherein the center wavelength in a high-reflectivity wavelength range falls within the gain wavelength range of the semiconductor laser medium element 1, the half-amplitude level of the reflectivity is less than or equal to two times the interval between element modes, the reflectivity is the highest particularly to the oscillation main longitudinal mode, and the spectrum width in the oscillation main longitudinal mode is included. In other words, this reflection wavelength characteristic is as indicated by the dashed line in FIG. 1 with respect to the spectrum (solid line) in oscillation longitudinal mode of the semiconductor laser medium element 1. In FIG. 1, $\Delta\lambda_1$ is a wavelength interval corresponding to one reciprocation time of a laser beam within the element 1, while $\Delta\lambda_2$ is a wavelength interval corresponding to a time required for the reciprocation of the laser beam within the external resonator. If the intermediate wavelength $\lambda_c$ is 850 nm, the optical length of the semiconductor laser medium element 1 is 300 μm and the resonator length, $L_{eff}$, is 15 cm, then $\Delta\lambda_1$ will be about 1.2 nm and $\Delta\lambda_2$ will be about 0.024 Å.

Figure 4:
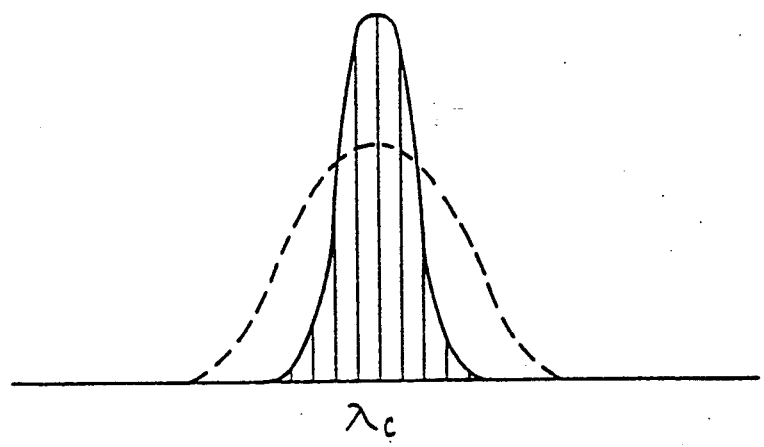
FIG. 4 is a diagram illustrating the spectrum (solid line) in oscillation longitudinal mode and the reflection wavelength characteristic (dashed line) of the reflecting element according to the present invention.

With the above structure, the distance between the high-reflection face 1a of the semiconductor laser medium element 1 and the reflecting element 3, that is, $L_{eff}$ (FIG. 2), is the resonator length, and a current having the bias-applying DC current $I_{DC}$ superimposed on the mode locking RD current $I_{RF}$ is applied to the element 1 to activate it with the mode-synchronizing frequency. With C representing the speed of light, the mode-synchronizing frequency $\nu$ is expressed as $\nu=C/2L_{eff}$. As the laser beam generated by the activated semiconductor laser medium element 1 reciprocates along the resonator length $L_{eff}$ with the mode-synchronizing frequency $\nu$, the laser beam grows as a short pulse synchronous with the frequency $\nu$. Part of this optical pulse passes through the reflecting element 3 to be an optical output. Since the reflecting element 3 has a reflection wavelength characteristic as indicated by the dashed line in FIG. 1, it suppresses components other than the component of the oscillation main longitudinal mode, as indicated by the solid line in FIG. 4, resulting in improvement of the level of the component of the oscillation main longitudinal mode. It is therefore possible to produce optical pulses with a narrower spectrum width and pulse width as the optical output.

As described above, according to the optical pulse generating apparatus of the present invention, the reflecting element in the optical waveguide path has a reflection wavelength characteristic wherein the center wavelength in a high-reflectivity wavelength range falls within the gain waveguide range of the semiconductor laser medium and the half-amplitude level is equal to or lower than twice the interval between device modes, so that components other than the component of the oscillation main longitudinal mode are suppressed, thus the level of the component of the oscillation main longitudinal mode is raised. It is therefore possible to produce optical pulses with a narrower spectrum width and pulse width even when the reflectivity of the end face of the semiconductor laser medium, where an optical fiber is coupled, is about 1%.

Since this optical pulse generating apparatus can produce optical pulses with a narrower spectrum width and pulse width, it is effective as a laser beam wavelength converting apparatus employing the SHG (Second Harmonics Generator) technology, an optical parametric oscillator, and a light source for a time resolving spectrum.

What is claimed is:

1. An optical pulse generating apparatus comprising a semiconductor laser medium and an external resonator for oscillating the semiconductor laser medium, in mode locking with a frequency of an injected current, to generate optical pulses;
   wherein said external resonator comprises an optical waveguide path including a reflecting element for reflecting part of a laser beam emitted from the semiconductor laser medium;
   said reflecting element having a reflection wavelength characteristic wherein a center wavelength in a high-reflectivity wavelength range falls within a gain wavelength range of the semiconductor laser medium and a half-amplitude level is equal to or lower than twice an interval between longitudinal modes dependent on an element's length of the semiconductor laser medium.

2. An optical pulse generating apparatus according to claim 1, wherein the reflecting wavelength has a characteristic such that reflectivity is highest at a center wavelength of the spectrum in the oscillation main longitudinal mode.

3. An optical pulse generating apparatus according to claim 1, wherein the reflecting wavelength has a characteristic such that it is narrower so as to include only a spectrum width of the oscillation main longitudinal mode.

4. An optical pulse generating apparatus according to claim 1, wherein the optical waveguide path is formed by an optical fiber.

5. An optical pulse generating apparatus according to claim 1, wherein said reflecting element is located at the center of said optical waveguide path.

6. An optical pulse generating apparatus according to claim 1, wherein said reflecting element has a plurality of multi-laminated transparent layers, each layer having different reflectivities, said layers being coated on a transparent substrate, such as glass, quartz, or alumina.

7. An optical pulse generating apparatus comprising:
   a mode-locked semiconductor laser medium injected with a periodic current of a given frequency; and
   an external resonator for forming an oscillator with the semiconductor laser medium to generate optical pulses, wherein said external resonator comprises an optical waveguide path including a reflecting element for reflecting part of a laser beam emitted from the semiconductor laser medium, said reflecting element having a reflection wavelength characteristic wherein a center wavelength in a high reflectivity wavelength range falls within a gain wavelength range of the semiconductor laser medium and a half-amplitude level is equal to or lower than twice an interval between longitudinal modes of the semiconductor laser medium, wherein said reflecting element has a plurality of multi-laminated transparent layers, each layer having a different reflectivity, said layers being coated on a transparent substrate, such as glass, quartz, or alumina, said reflecting element having a reflectivity of 0.6.

8. An optical pulse generating apparatus according to claim 7, further comprising a means for supplying a bias-applying DC current superimposed on a high frequency RF current for mode-locking so as to activate said semiconductor laser medium with a mode-synchronizing frequency.

* * * * *